(12) United States Patent
Nasiri et al.

(10) Patent No.: US 6,533,947 B2
(45) Date of Patent: Mar. 18, 2003

(54) MICROELECTROMECHANICAL MIRROR AND MIRROR ARRAY

(75) Inventors: Steven Nasiri, Saratoga, CA (US); James H. Smith, Campbell, CA (US); David Lambe Marx, Dublin, CA (US); Mitchell Joseph Novack, Kenmore, WA (US)

(73) Assignee: Transparent Optical, Inc., Santa Clara, CA (US)

( * ) Notice: Subject to any disclaimer, the term of this patent is extended or adjusted under 35 U.S.C. 154(b) by 85 days.

(21) Appl. No.: 09/894,021

(22) Filed: Jun. 27, 2001

(65) Prior Publication Data

US 2002/0131682 A1 Sep. 19, 2002

Related U.S. Application Data

(62) Division of application No. 09/779,189, filed on Feb. 7, 2001, now Pat. No. 6,480,320.

(51) Int. Cl.$^7$ .................... B81B 7/04; G02B 26/00; H01L 41/22
(52) U.S. Cl. ................ 216/2; 216/24; 216/33; 438/29
(58) Field of Search .............. 216/2, 24, 33; 438/29

(56) References Cited

U.S. PATENT DOCUMENTS

| | | | |
|---|---|---|---|
| 5,535,047 A | 7/1996 | Hornbeck | 359/295 |
| 5,583,688 A | 12/1996 | Hornbeck | 359/291 |
| 5,648,618 A | 7/1997 | Neukermans et al. | 73/862.08 |
| 5,867,302 A | 2/1999 | Fleming | 359/291 |
| 5,960,132 A | 9/1999 | Lin | 385/18 |
| 6,028,689 A | 2/2000 | Michalicek et al. | 359/224 |
| 6,040,935 A | 3/2000 | Michalicek | 359/198 |
| 6,044,705 A | 4/2000 | Neukermans et al. | 73/504.02 |
| 6,198,180 B1 | 3/2001 | Garcia | 310/36 |
| 6,256,134 B1 | 7/2001 | Dhuler et al. | 359/212 |
| 6,283,601 B1 | 9/2001 | Hagelin et al. | 359/871 |
| 2001/0048265 A1 | 12/2001 | Miller et al. | 310/309 |

FOREIGN PATENT DOCUMENTS

| | | | |
|---|---|---|---|
| WO | WO 01/88594 | 11/2001 | G02B/26/00 |
| WO | WO 01/96930 | 12/2001 | G02B/26/08 |

OTHER PUBLICATIONS

Anita K. Alanko, PCT International Search Report, Jul. 10, 2002, Washington, D.C.

Georgia Y. Epps, PCT International Search Report, Aug. 1, 2002, Washington, D.C.

Toshiyoshi and Fujita, "Electrostatic Micro Torsion Mirrors for an Optical Switch Matrix," *Journal of Microelectromechanical Systems*, 1996, 5(4):231–237.

*Primary Examiner*—Anita Alanko
(74) *Attorney, Agent, or Firm*—Fish & Richardson P.C.

(57) ABSTRACT

Method for manufacturing microelectromechanical mirror and mirror array. Control electrodes and addressing circuitry are etched from a metallic layer deposited onto a reference layer substrate. Standoff-posts are etched from a subsequently deposited polyimide layer. A freely movable plate flexibly suspended from a plurality of electrostatic actuators that are flexibly suspended from a support frame is etched from an actuation layer substrate using a high aspect ratio etch. A mirror support post and surface are etched from a mirror substrate using a high aspect ratio etch. The mirror and actuation layer substrates are fusion bonded together. The reference and actuation layer substrates are bonded together and held apart by the standoff posts. A reflective metallic layer is deposited onto the mirror surface and polished. The mirror is etched from the mirror surface to free the microelectromechanical mirror. Mirror arrays are made by performing the aforementioned steps using standard IC processing techniques.

65 Claims, 10 Drawing Sheets

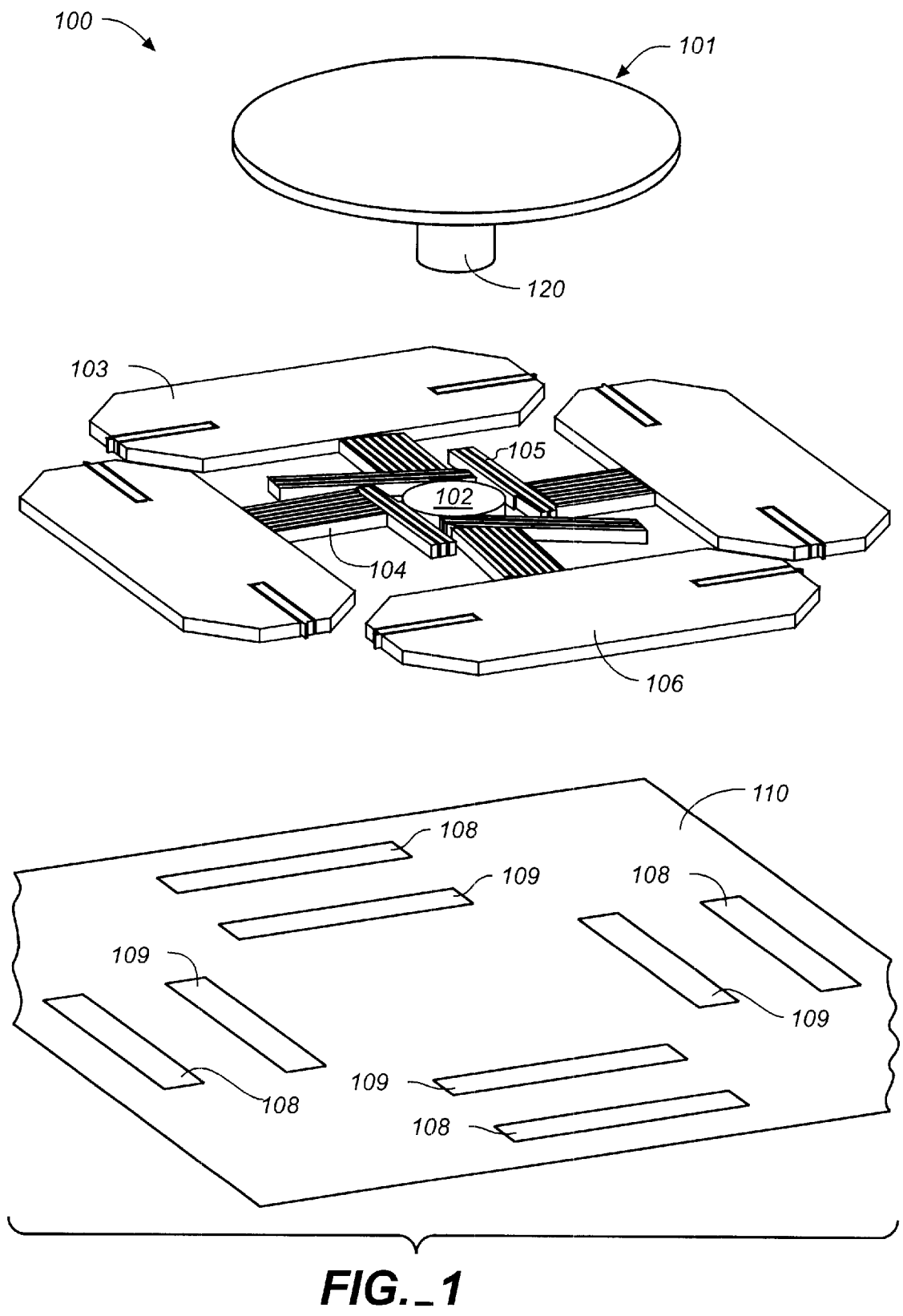
FIG._1

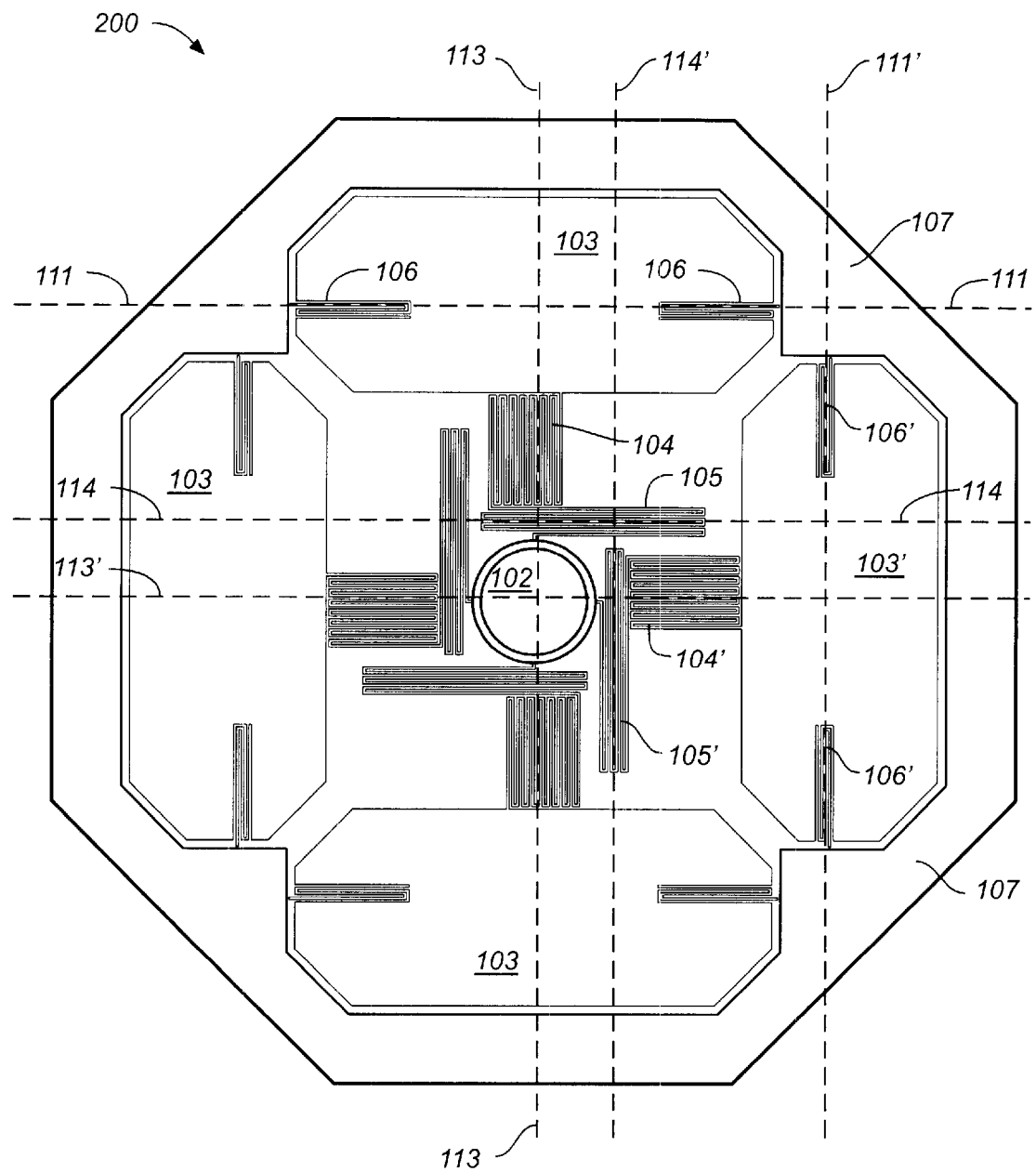
FIG._2

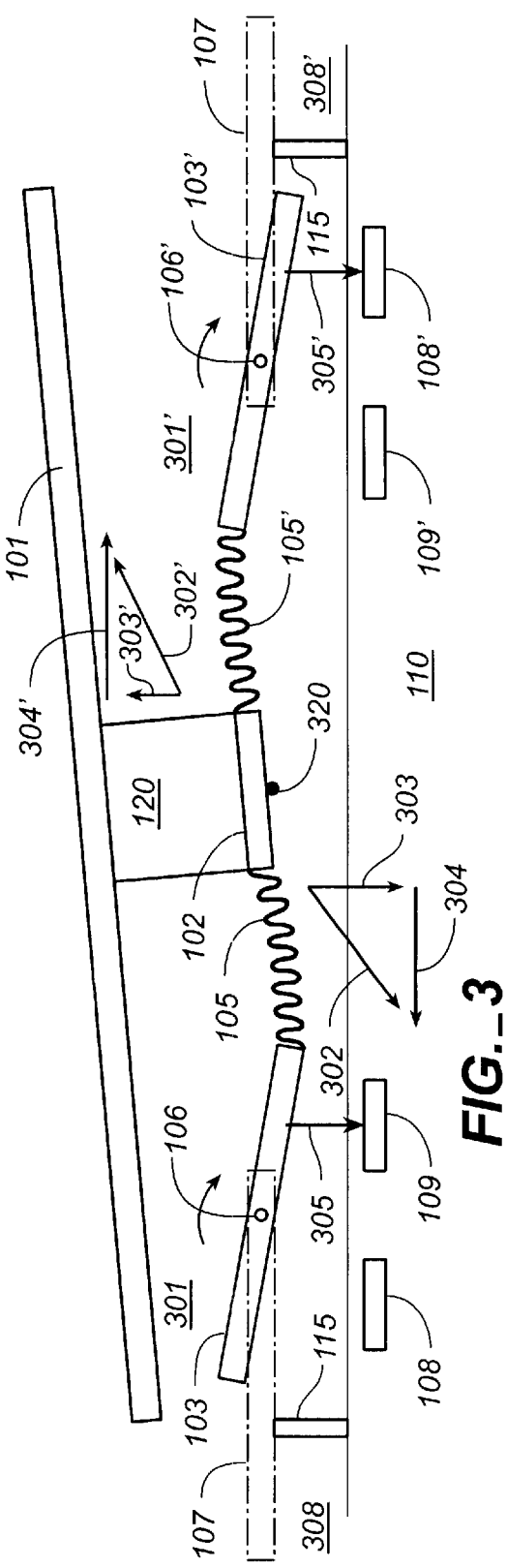
FIG._3
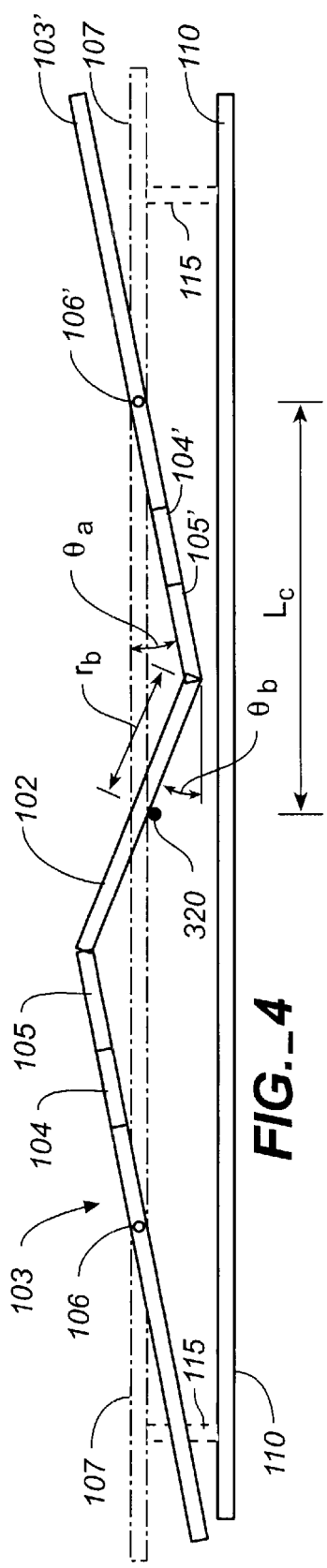
FIG._4

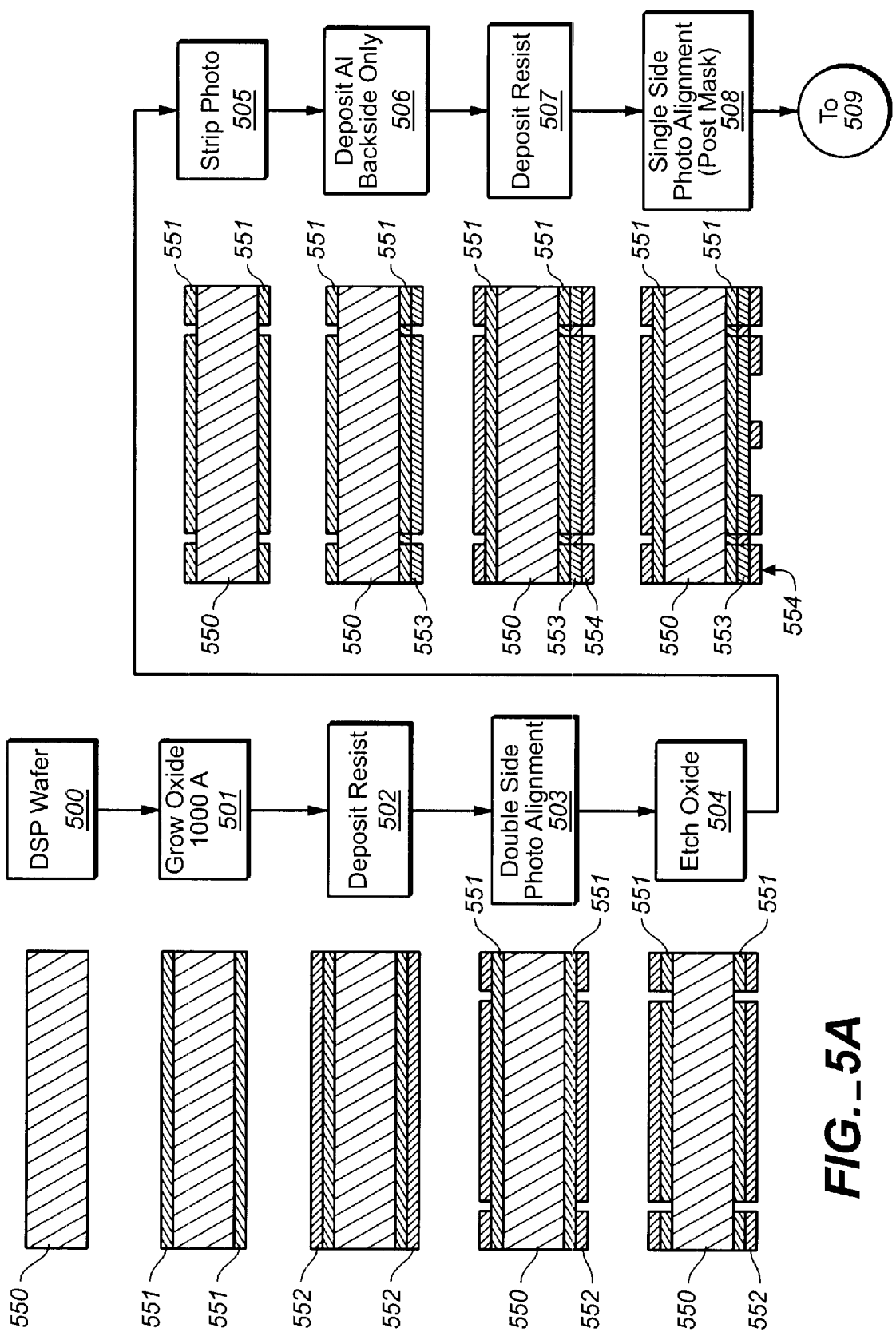
FIG._5A

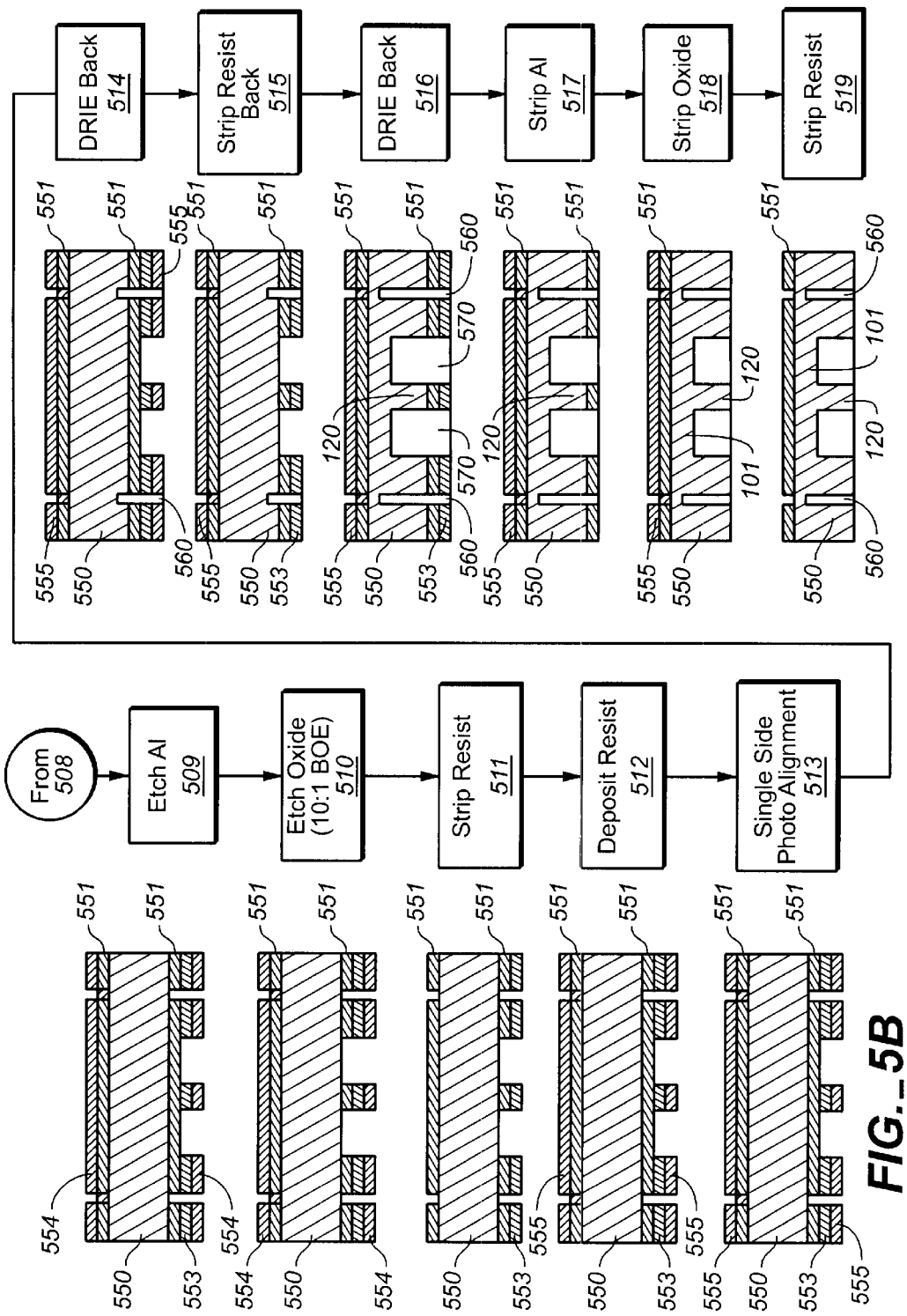
FIG._5B

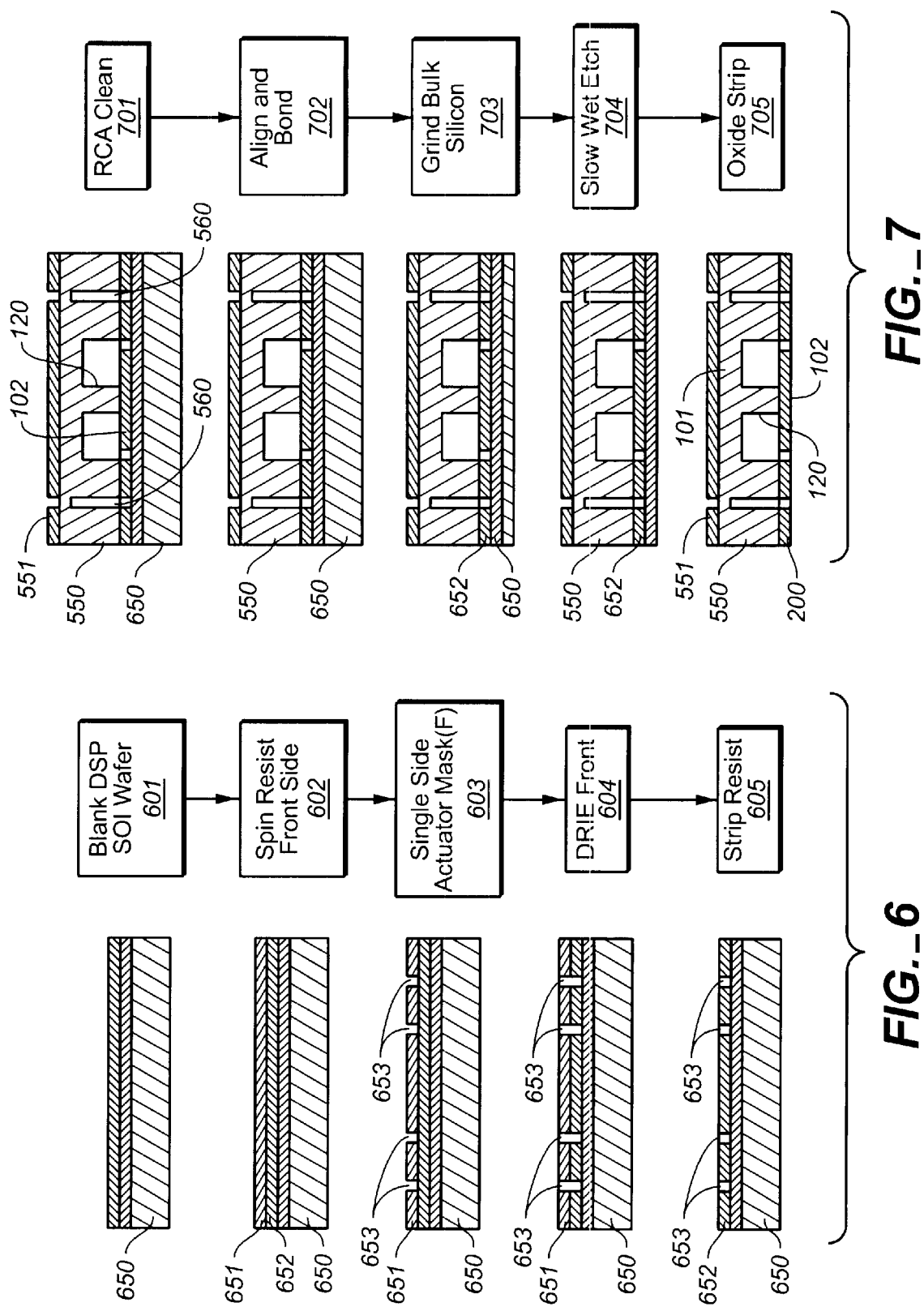
FIG._7
FIG._6

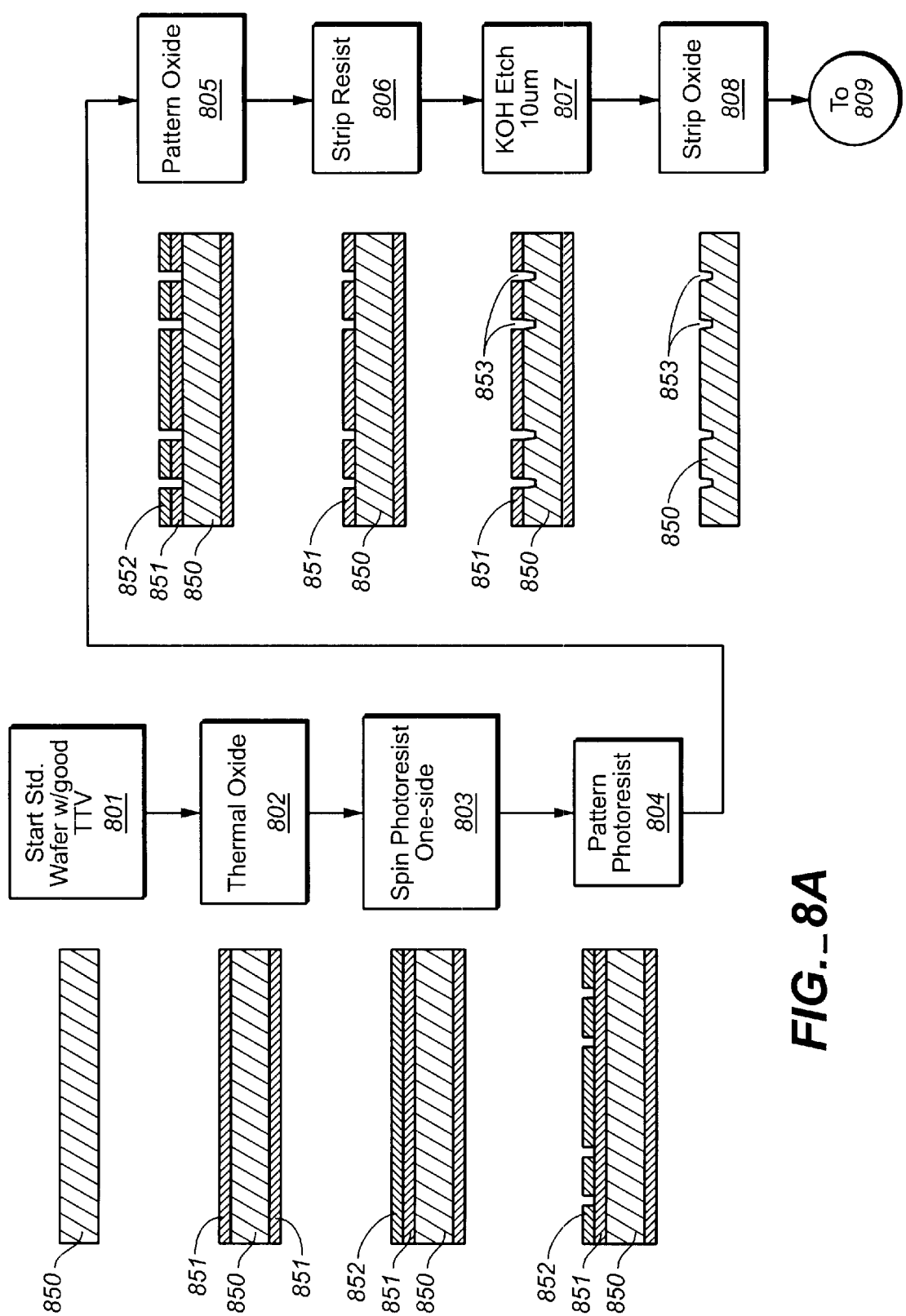
FIG._8A

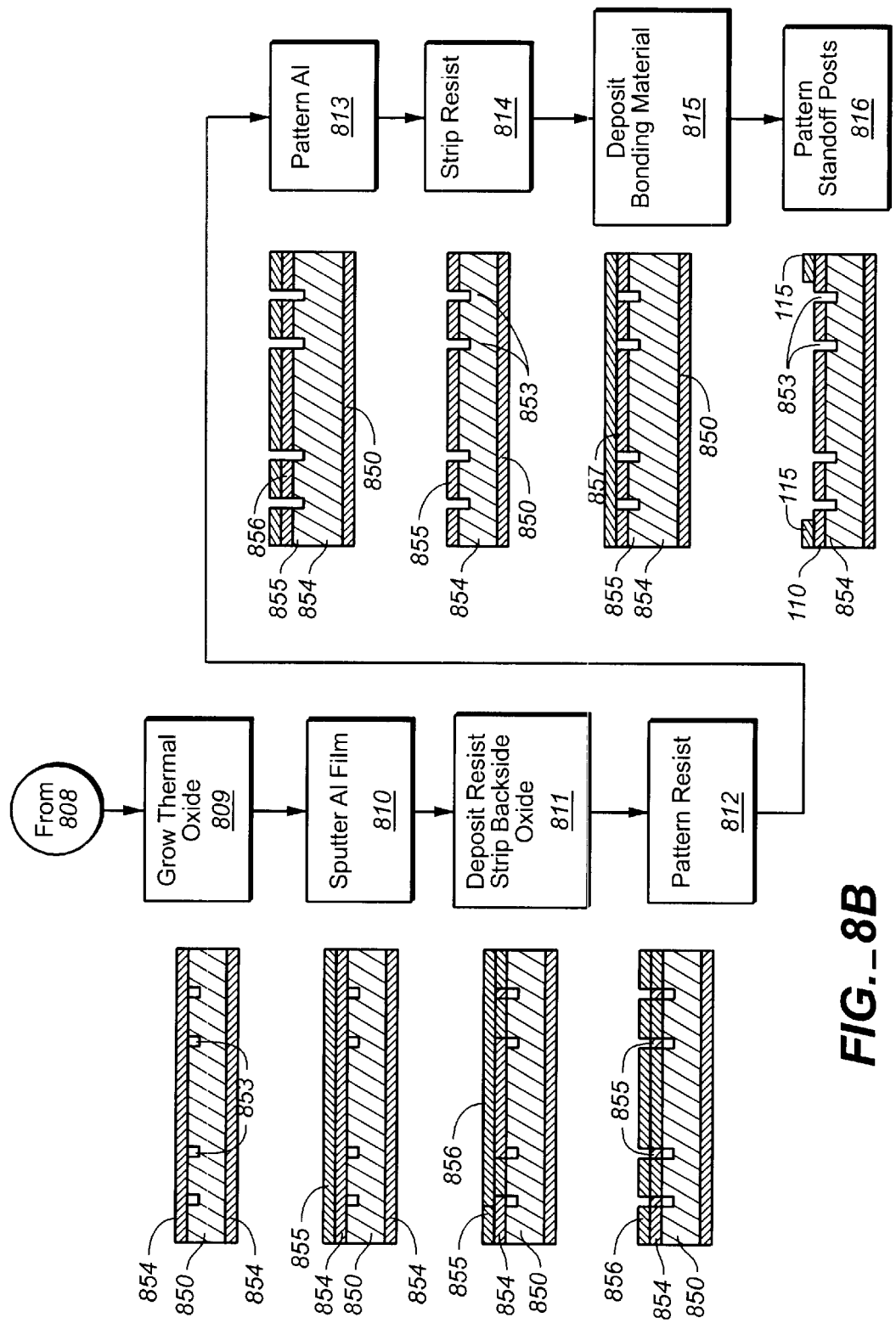
FIG._8B

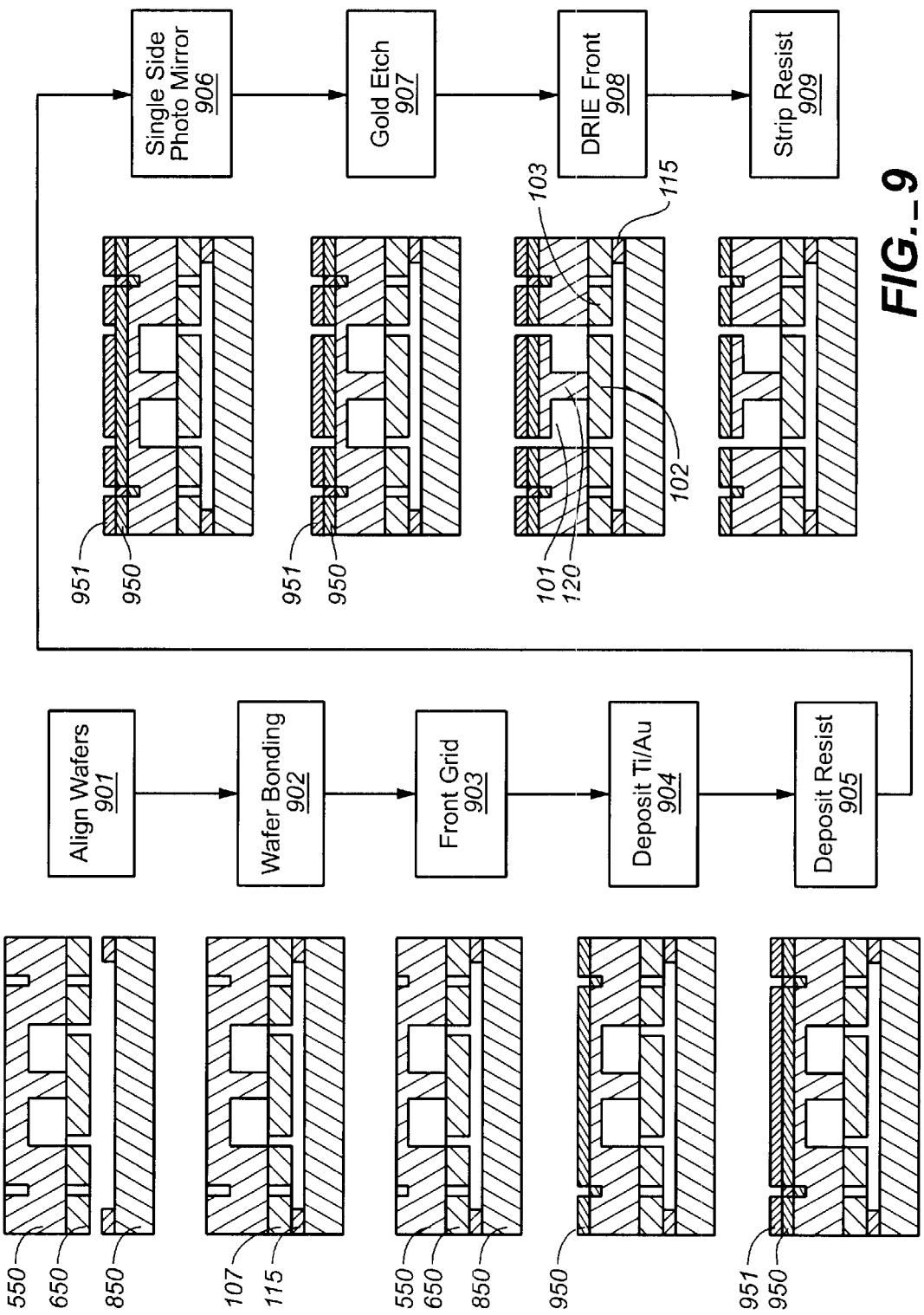

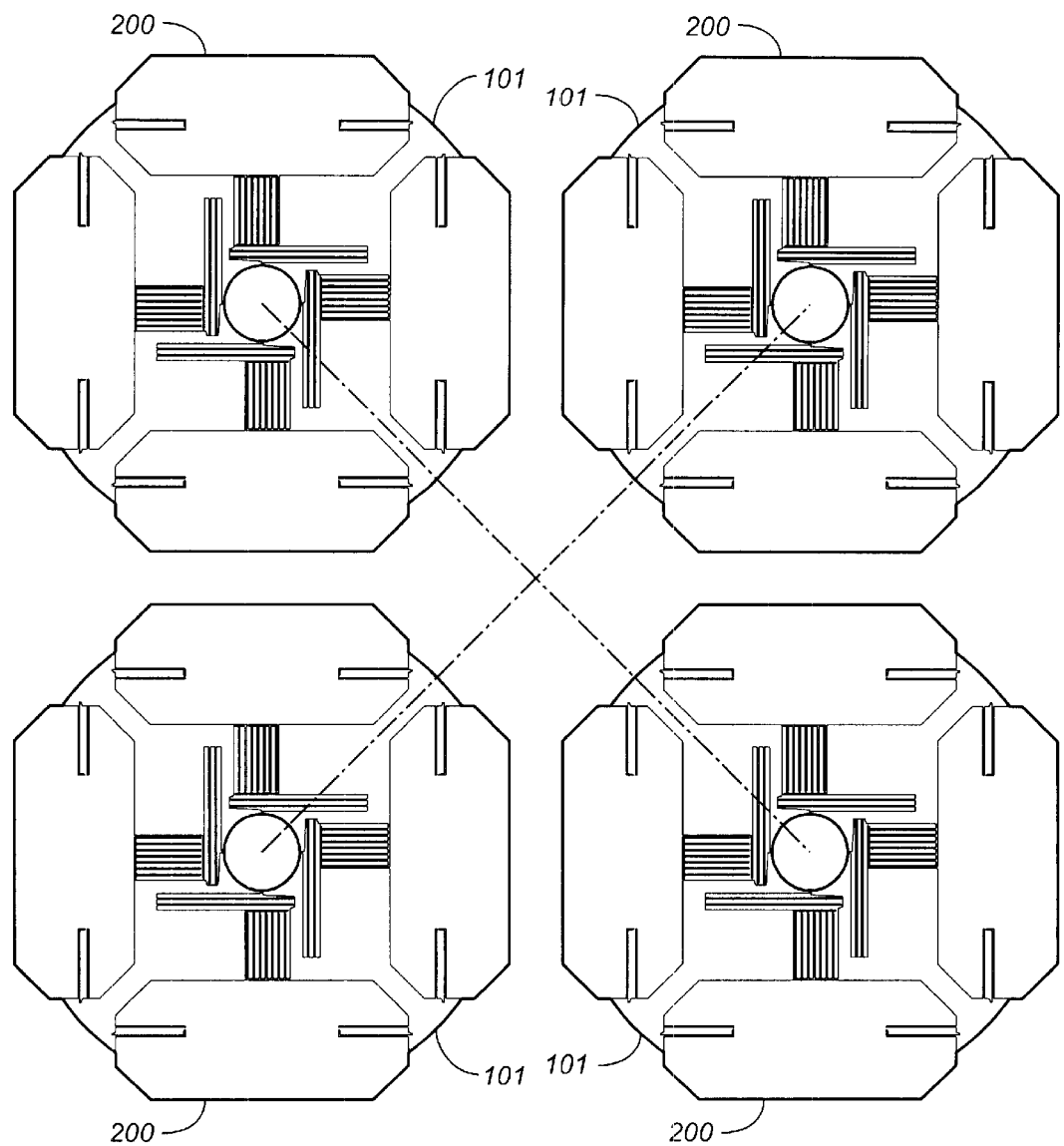
FIG._10

MICROELECTROMECHANICAL MIRROR AND MIRROR ARRAY

CROSS REFERENCE TO RELATED APPLICATIONS

This application is a division of application Ser. No. 09/779,189 filed on Feb. 7, 2001, and claims the benefit of the priority date of the above referenced application.

TECHNICAL FIELD

This invention relates to microelectromechanical mirrors and mirror arrays, and a method for manufacturing the same.

BACKGROUND

As the internet has grown, so too has the strain on the telecommunications infrastructure. As more and more information is transmitted across the Internet, and the demand for information rich content like streaming video has grown, telecommunication providers have struggled to provide the necessary bandwidths and data rates necessary to carry the requisite data. To that end, telecommunications providers have looked to carrying more and more data on fiber optic networks, and to extending the reach of their fiber optic networks beyond the network backbone.

One limitation of fiber optic networks as currently implemented is their inability to directly switch optically encoded packets of data from a fiber on a source network or network node to a fiber on a destination network or network node. Instead, the optically encoded data is dropped from the source network fiber, converted to electrically encoded data, switched to the destination network using conventional electronic switches, converted back into optically encoded data, and injected into the destination network fiber.

Micromachined mirror arrays offer the ability to directly switch optically encoded data in devices known as all-optical cross connect switches from a source fiber on a source network to a destination fiber on a destination network without having to convert the data from optical to electronic and back again. For such mirror arrays to be commercially useful, they must be able to cross connect approximately 1000 input fibers with an equal number of output fibers in a compact volume. This can be achieved with mirrors that can be densely packed together and that are rotatable by relatively large angles (~5°) in an arbitrary angular direction.

Recent developments in the field of microelectomechanical systems (MEMS) allow for the bulk production of microelectromechanical mirrors and mirror arrays that can be used in all-optical cross connect switches. MEMS-based mirrors and mirror arrays can be inexpensively designed and produced using conventional tools developed for the design and production of integrated circuits (IC's). Such tools include computer aided design (CAD), photolithography, bulk and surface micromachining, wet and dry isotropic and anisotropic etching, and batch processing. In addition, deep reactive ion etching methods (DRIE) allow silicon devices to be produced having high aspect ratios (~20:1) that rival those that can be achieved using the prohibitively expensive lithography, electroplating and molding process (LIGA) which requires access to a synchrotron radiation source. (LIGA is an acronym for the German lithographie, galvanoformung und abformung).

A number of microelectromechanical mirror arrays have already been built using MEMS production processes and techniques. These arrays have designs that fall into approximately three design categories, each of which suffers from one or more limitations that make them sub-optimal for use in an all-optical cross connect switch.

The first and simplest design is illustrated by U.S. Pat. No. 5,960,132 to Lin. In this design, a reflective panel is hinged to a reference base and is electrostatically rotated about the hinge. Since the panel's freedom of motion is limited to rotation about the hinge, light incident on the panel cannot be reflected in an arbitrary angular direction ($d\theta$, $d\phi$) but only along an arc defined by a single angle, i.e., $d\theta$ or $d\phi$. As a result, light incident from a source fiber cannot be directed to an arbitrary output fiber but only to those output fibers located along the defined arc. Consequently, Lin's system requires large and costly system redundancies to connect a plurality of input fibers to a plurality of output fibers. These redundancies can be in either the number of output fibers or in the number of mirrors. In Lin, the redundancy is in the number of mirrors, where $N^2$ mirrors are used to connect N input fibers to N output fibers. An optimal system would only require N mirrors to make the N input to N output possible fiber interconnections.

A more sophisticated design is illustrated in U.S. Pat. No. 6,044,705 to Neukermans et al which is hereby incorporated by reference. In Neukermans, a gimbal is mounted on a first hinge connected to a reference surface, while a mirror is mounted on a second hinge connected to the gimbal. The first and second hinges are orthogonal to each other and allow the mirror to be rotated in an arbitrarily angular direction ($d\theta$, $d\phi$). The gimbal is electrostatically rotated about the first hinge by applying a potential between it and electrodes located on the reference surface. The mirror is electromagnetically rotated about the second hinge by injecting a current in a conductive coil wrapped around the mirror perimeter. The current flow through the coil generates a small magnetic moment which couples to a permanent magnetic field established across the plane of the mirror (e.g. with bar magnets), and causes the mirror to rotate. While Neukermans use of a gimbal thus allows the mirrored surface to rotate in an arbitrary angular direction, it also makes the system more mechanically and electrically complex than it needs to be. The mechanical complexity increases the sensitivity of the system to mechanical vibrations, while the electrical complexity increases the intricacy of the electrostatic and electromagnetic actuators. Both complexities increase the cost of producing the system. Additionally, Neukermans electromagnetic actuator coil occupies a large amount of the surface of the device, thus reducing the mirrored surface area and the mirror density.

A third mirror design is illustrated in U.S. Pat. No. 6,040,953 to Michalicek. In Michalicek, a mirror is mounted on a central post anchored to a locking pin joint that is carved into a reference surface. The post can be electrostatically actuated to freely rotate about the pin joint in an arbitrary direction. However, because the post is not mechanically attached to the pin joint with flexures, it can only be stably rotated in directions where the mirrored surface can be supported by a landing pad provided for that purpose. The mirror can therefore only be rotated and held in a fixed number of stable positions. In Michalicek's preferred embodiment, the mirror can only be rotated to and held in two stable positions.

SUMMARY OF THE INVENTION

The invention discloses a method for manufacturing a freely movable plate and a microelectromechanical mirror and mirror array utilizing the freely movable plate. The freely movable plate, and microelectromechanical mirror and mirror array can be fabricated from a plurality of silicon substrates using standard IC processing steps such as wet and dry chemical etching, photolithography, bulk and surface silicon micromachining, and deep reactive ion etching.

In one aspect, the invention discloses a method for manufacturing a freely movable plate from an actuation layer wafer and a reference layer wafer. The actuation layer wafer can be a single crystal silicon wafer such as a silicon-on-oxide (SOI) wafer. A photoresist layer can be deposited onto the actuation layer wafer and patterned with a mask for one or more actuators that may be electrostatically, electromagnetically, piezoelectrically or thermally actuated. The actuation layer mask can include masking for a support frame, a plurality of actuators and actuator flexures, a freely movable plate, and a plurality of plate flexures. The photoresist layer can be patterned with alignment marks to align the actuation layer wafer with a mirror layer wafer in a microelectromechanical mirror. Portions of the actuation layer wafer exposed by the actuator mask can be etched away using a high aspect ratio etch such as a DRIE etch. The remaining photoresist can be stripped away.

The actuation layer can be actuated by actuation means deposited onto, etched into, or etched from a reference layer wafer. A conductive layer including control electrodes and their associated traces can be deposited onto the surface of the reference wafer layer. In one embodiment, the control electrodes are deposited by growing a thermal oxide layer on the reference layer wafer; depositing a conductive layer over the oxide layer; depositing a photoresist layer over the conductive layer; patterning the photoresist layer with a mask for control electrodes and their associated traces; etching the control electrodes and their associated traces from the conductive layer; and stripping away the remaining photoresist.

An optional mechanical stopping layer can be deposited and patterned onto the top surface of the reference layer wafer to electrically isolate the actuation layer structures from the reference layer structures. The mechanical stopping layer can be made from a material such as a polyimide that can provide a small leakage path to ground. The stopping layer can electrically isolate the actuation and reference layer structures, and dissipate any charge buildup that might occur between them to prevent long term voltage drifts between the structures. In one embodiment, the stopping layer is deposited as a polyimide layer that is patterned and etched to produce an array of polyimide dots or a sequence of polyimide stripes on the surface of the reference layer wafer.

A separation layer can be deposited onto the top surface of the reference layer wafer to hold the actuation layer structures above the reference layer structures. In one embodiment, the separation layer is made from a polyimide layer, however, other materials such as low temperature solders may be used. A plurality of standoff posts can be etched into the separation layer to support the actuation layer wafer above the reference layer wafer. The reference and actuation layer wafers can be bonded together using a low temperature bonding technique after aligning the reference layer standoff posts with the actuation layer support frame.

In another aspect, the invention discloses a method for manufacturing a microelectromechanical mirror utilizing the freely movable plate. The mirror can be made from reference and actuation layer wafers as previously described, and from a mirror layer wafer. The mirror layer wafer can be bonded to the actuation layer wafer before the actuation layer wafer is bonded to the reference layer wafer. The mirror layer wafer can be a single crystal silicon wafer. A mirror support post and mirrored surface can be etched from the wafer using a high aspect ratio etch. The mirror support post can be etched from the mirror layer wafer by depositing a hard mask such as an Aluminum mask onto the mirror layer wafer; depositing photoresist over the hard mask; transferring a mirror support post mask to the photoresist, etching away portions of the hard mask exposed by the mirror support post mask; stripping away the photoresist; etching the mirror support post from the mirror layer wafer using a high aspect ratio etch; and stripping the hard mask from the mirror layer wafer. Alignment bores can be etched into the mirror layer wafer to facilitate aligning the mirror layer wafer with the actuation layer wafer.

The mirror layer wafer can then be fusion bonded to the actuation layer wafer such that the mirror support post of the mirror layer wafer is bonded to the freely movable plate of the actuation layer wafer. The mirror and actuation layer wafers can be thoroughly cleaned before they are bonded together using a commercially available wafer cleaning process such as the RCA process. The cleaned wafers can be aligned along their respectively etched alignment bores before being fusion bonded together. Once bonded to the mirror layer wafer, the bulk of the actuation layer wafer can be ground away, while the remainder can be slowly etched away. The combined mirror and actuation layer wafers can then be bonded to the reference layer wafer as previously disclosed.

A reflective layer such as a 1000 Å thick gold layer can be deposited onto the top surface of the mirror layer wafer. A photoresist can be deposited over the reflective layer and patterned with a mirror mask. Portions of the reflective layer and of the mirror layer wafer exposed by the mirror mask can be etched away to free the mirrored surface using a high aspect ratio etch. The remaining photoresist can be stripped away to the complete microelectromechanical mirror structure.

In another aspect of the invention, the disclosed processes for making an individual microelectromechanical mirror can be readily adapted to make a plurality of mirrors in a mirror array by regularly repeating the process masks needed to make a single mirror. The process masks can be repeated to produce a mirror array of arbitrary geometry, and in one embodiment a 30×40 mirror array is made for use in an all optical cross connect switch.

The details of various embodiments of the invention are set forth in the accompanying drawings and the description below. Other features, objects and advantages of the invention will be apparent from the description, drawings and claims.

DESCRIPTION OF DRAWINGS

FIG. 1 is a perspective view of an electrostatically actuated microelectromechanical mirror in accordance with the present invention.

FIG. 2 is a view of the microelectromechanical mirror's electrostatic actuator layer.

FIG. 3 is a side view of the mirror illustrating its principle of rotation.

FIG. 4 is a side view of the microelectromechanical mirror illustrating the magnification of the mirror rotational angle.

FIGS. 5A–5B are an illustration of the process used to make the mirror support layer.

FIG. 6 is an illustration of the process used to make the electrostatic actuation layer.

FIG. 7 is an illustration of the process used to bond the electrostatic actuation layer to the mirror support layer.

FIGS. 8A–8B are an illustration of the process used to make the reference surface layer with control electrodes.

FIG. 9 is an illustration of the process used to bond the reference layer to the actuation and mirror support layers.

FIG. 10 is a view of the distribution of actuation layers in an array of microelectromechanical mirrors.

Like reference symbols in the various drawings indicate like elements.

DETAILED DESCRIPTION OF THE PREFERRED EMBODIMENT

An electrostatically actuated electromechanical mirror 100 in accordance with one embodiment of the present invention is shown in FIG. 1. In the embodiment of FIG. 1, mirror 100 consists of an elliptical mirrored surface 101 having a major axis of 1000 μm, a minor axis of 900 μm and a thickness of 25 μm. The mirrored surface is made elliptical to reduce the coupling of resonances between the orthogonal rotational directions of the mirror, and to better match the optical requirements when the mirror is used as a switching element in an all-optical cross connect switch. Other embodiments are possible however, and still within the scope of the invention. For example, the mirrored surface can be made circular, square, rectangular or elliptical with greater or lesser eccentricity than that disclosed in the embodiment described.

The mirrored surface 101 is mounted onto the top surface of a support post 120 having a radius of 70 μm, and a thickness of 50 μm. The height of support post 120 is chosen so that the intersection of mirrored surface 101 with actuators 103 or reference surface 110 during rotation of plate 102 forms a shock protection cage for mirror 100. The bottom surface of support post 120 is connected to the top surface of a freely movable, arbitrarily rotatable, electrostatically actuated plate 102 having a radius of 70 μm and a thickness of 25 μm.

As shown in FIG. 2, freely movable plate 102 is suspended from four electrostatic actuators 103 that are themselves suspended from a support frame 107 in an electrostatic actuation layer 200. The electrostatic actuators 103 are used to rotate freely movable plate 102 in an arbitrary angular direction. As plate 102 rotates, so do central support post 120 (FIG. 1) and mirrored surface 101 (FIG. 1) which are rigidly attached. Mounting mirrored surface 101 (FIG. 1) above electrostatically actuated plate 102 (FIG. 1) and actuation layer 200 allows a plurality of mirrors 100 (FIG. 1) to be packed densely together in a mirror array such that the surface of the array is largely mirrored. In this way, light can be readily switched from a plurality of input fibers to a plurality of output fibers in a compact volume in an all optical cross connect switch.

Electrostatic actuators 103 are 25 μm thick, 230 μm wide and 600 μm long. The actuators 103 are suspended from frame 107 by pairs of torsional flexures 106. The torsional flexures 106 are 25 μm thick, 40 μm wide and 150 μm long. They define axes of rotation 111 about which the electrostatic actuators 103 can rotate, and functionally divide each actuator 103 into two ends located on opposite sides of axis 111 that are respectively distal and proximal to plate 102. The distance from axis 111 to the center of plate 102 is 385 μm.

The electrostatic actuators 103 are connected to freely movable plate 102 via pairs of plate flexures 104 and 105. Plate flexures 104 couple each electrostatic actuator 103 to plate flexures 105 and flex about their symmetry axes 113. They are 25 μm thick, 110 μm wide and 150 μm long. Plate flexures 104 serve to absorb rotational energy transferred to electrostatic actuators 103 from other components of mirror 100 (FIG. 1), and to decouple the rotation of the actuator to which they are connected from the rotation of other mirror components. Plate flexures 105 couple plate flexures 104 to freely movable plate 102, and flex about their symmetry axes 114. They are 25 μm thick, 60 μm wide and 270 μm long. Plate flexures 105 serve to pull movable plate 102 toward or away from reference surface 110 (FIG. 1) when electrostatic actuators 103 are rotated about axes 111.

As shown in FIG. 3, actuator frame 107 is held away from reference surface 110 by a number of standoff posts 115. Four pairs of control electrodes 108 and 109 in reference surface 110 lie directly below and capacitively couple to the distal and proximal ends of the electrostatic actuators 103 that are suspended from the frame 107. The standoff posts 115 separate the control electrodes 108 and 109 from the actuators 103 by a 10 μm gap 308 when the actuators 103 are in their neutral or non-rotated state. In a preferred embodiment, standoff posts 115 are made from polyimide and serve to electrically isolate actuator frame 107, electrostatic actuators 103 and freely movable plate 102 from reference surface 110. In this embodiment, a bias voltage of negative 60 V is applied to the actuation layer 200 (FIG. 2) or to frame 107, actuators 103 and plate 102.

When a control voltage is applied to an electrode 109 under the proximal end of an actuator 103, a charge develops on electrode 109 that is proportional to the capacitive coupling between the electrode and the proximal end of the actuator 103. This charge creates an electrostatic force 305 between the proximal end of actuator 103 and electrode 109, substantially in the direction shown. The force has a magnitude that is proportional to the square of the difference between the bias voltage and the control voltage, and that is inversely proportional to the square of the gap 308 between actuator 103 and electrode 109. Force 305 exerts a torque 301 on actuator 103 about axis of rotation 111 (FIG. 2) defined by flexures 106. The torque causes flexures 106 to extend, thereby allowing actuator 103 to rotate toward electrode 109. When a bias voltage of negative 60 V is applied to the actuation layer 200 (FIG. 2), a control voltage of positive 120 V causes actuator 103 to rotate toward electrode 109 by approximately 1 degree. As actuator 103 rotates, it pushes flexure 105 toward reference surface 110, causing it to extend as shown. As flexure 105 extends, it exerts a restoring force 302 substantially in the direction shown having a component 303 that pulls freely movable plate 102 toward reference surface 110, and a component 304 that pulls plate 102 toward flexure 106.

Similarly, when a control voltage is applied to an electrode 108' under the distal end of an actuator 103' that attaches to freely movable plate 102 at a point that is directly opposite the attachment point of actuator 103, a charge develops on electrode 108' that is proportional to the capacitive coupling between the electrode and the distal end of the actuator 103'. This charge creates an electrostatic force 305' between the distal end of actuator 103' and electrode 108' substantially in the direction shown. The force has a magnitude that is proportional to the square of the difference between the bias voltage and the control voltage, and that is inversely proportional to the square of the gap 308' between control electrode 103' and electrode 108'. Force 305' exerts a torque 301' on actuator 103' about axis of rotation 111' (FIG. 2) defined by flexures 106'. The torque causes actuator flexures 106' to extend, thereby allowing actuator 103' to rotate toward electrode 108'. As actuator 103' rotates, it lifts flexure 105' away from reference surface 110, causing it to extend as shown. As flexure 105' extends, it exerts a restoring force 302' substantially in the direction shown having a component 303' that pulls freely movable plate 102 away from reference surface 110, and a component 304' that pulls plate 102 toward flexure 106'.

When similar control voltages are applied to proximal electrode 109 beneath electrostatic actuator 103 and to distal electrode 108' beneath electrostatic actuator 103' as shown, flexures 105 and 105' extend as shown and exert respective restoring forces 302 and 302' substantially in the directions shown. Restoring forces 302 and 302' have respective components 303 and 303' that respectively push and pull freely movable plate 102 toward and away from reference surface 110 with equal force. Consequently, plate 102 does not experience a net vertical force and is not translated in the vertical direction. Nonetheless, force components 303 and 303' create a net torque about a virtual axis of rotation orthogonal to the plane of FIG. 3 and intersecting the plane at point 320. This torque causes movable plate 102 to rotate toward flexure 106 as shown. Restoring forces 302 and 302' also have respective components 304 and 304' that pull plate 102 in opposite lateral directions with equal force. Since no net lateral force is exerted on plate 102, the plate is not translated in the lateral direction of either force component 304 or 304'.

The two flexure electrostatic actuation method disclosed in FIG. 3 is one example of a multiple flexure actuation method that allows the freely movable plate to be rotated about an arbitrary axis of rotation (defined by the net torque) without being translated or stressed. In general, the multiple flexure actuation method involves selectively applying control voltages to the control electrodes beneath two or more of the suspended electrostatic actuators, so that the restoring forces exerted by the flexures attaching the actuators to the suspended plate will create a net torque on the plate, , but no net force, when the actuators are rotated.

This method of actuating freely movable plate 102 has several advantages over prior art actuation methods. One advantage, is that no stress is applied to plate 102 as it is rotated since no net force is applied to the plate. Similarly, since support post 120 and mirrored surface 101 are rigidly attached to plate 102, no stress is applied to either of these objects as they are rotated along with plate 102.

A second advantage is that the opposing restoring forces created by opposing actuators 103 and 103' that are selectively rotated allows a greater critical force to be applied to each actuator. For example, the upward component 303' of the restoring force of flexure 105' increases the critical force that can be applied to actuator 103. Similarly, the downward component 303 of the restoring force of flexure 105 increases the critical force that can be applied to actuator 103'. The critical force is the force at which the deflection of an electrostatic actuator 103 becomes unstable, and the actuator collapses upon one of its control electrodes 108 or 109. Since the force is inversely proportional to the square of the gaps 308 between the actuators 103 and their control electrodes 108 or 109, increasing the critical force increases the percentage of the gaps 308 that can be used to rotate the actuators 103. Consequently, actuators 103 can be rotated to larger critical angles than are possible in prior art actuators. For example, prior art actuators are typically able to utilize only 30% to 40% of the gap between the actuators and their electrodes. The disclosed actuation methods allows 80% of gap 308 to be used to rotate actuators 103. Alternatively, since the critical force is inversely proportional to the square of gap 308, increasing the critical force that can be applied to actuators 103 allows the size of gap 308 to be reduced, thereby allowing electrostatic actuators 103 to be controllably rotated with smaller control voltages.

As shown in FIG. 4, a third advantage of the multiple flexure electrostatic actuation method is that it allows plate 102 to be rotated by an angle that is magnified with respect to the angle by which actuators 103 and 103' are rotated. When electrostatic actuators 103 and 103' are respectively rotated about flexures 106 and 106' by angle $\theta_a$, plate 102 is rotated about virtual axis of rotation 320 by an angle $\theta_b$. If plate 102 has radius $r_b$ and the distance between virtual axis of rotation 320 and flexures 106 and 106' is $L_0$, then for small rotation angles ($\theta_a, \theta_b \ll 1$ radian), $\theta_b$ is related to $\theta_a$ by the expression:

$$\theta_b \approx \left(\frac{L_0}{r_b}\right) \cdot \theta_a \tag{1}$$

The ratio ($L_0/r_b$) defines the magnification factor for the angular rotation of plate 102. In a preferred embodiment, $L_0$ is 385 μm, $r_b$ is 70 μm, and plate 102 is rotated by an angle $\theta_b$ that is 5.5 times larger than the angle $\theta_a$ by which actuators 103 and 103' are rotated. Since actuators 103 are designed to rotate by as much as 1 degree, plate 102 and attached mirrored surface 101 can be rotated by as much as 5.5 degrees.

FIG. 3 discloses a method for rotating mirrored surface 101 by an arbitrary angle in a single angular direction. In general, to rotate mirrored surface 101 by an arbitrary angle in an arbitrary angular direction (dθ, dφ), a minimum of three electrostatic actuators 103 must be connected to electrostatically actuated plate 102. While the three or more electrostatic actuators 103 need not be symmetrically distributed around plate 102, certain advantages are achieved when they are so distributed. Thus, advantages are achieved when three electrostatic actuators 103 are distributed at 120 degree intervals around plate 102, or when four actuators 103 are distributed at 90 degree intervals around plate 102. Symmetrically distributing electrostatic actuators 103 around electrostatically actuated plate 102 simplifies the control voltages that need to be supplied to electrodes 108 and 109 to rotate mirrored surface 101 by an arbitrary angle in an arbitrary angular direction.

The microelectromechanical mirror 100 described in FIGS. 1–4 can be fabricated using standard IC processing steps as shown in FIGS. 5 through 9. As shown in FIG. 5A, the mirror support post 120 and mirrored surface 101 (both in FIG. 1) are made from a single crystal silicon wafer 550 according to the process disclosed in steps 500–519. In one embodiment, wafer 550 is a double-side-polished (DSP) wafer having a total thickness variation of less than 3 μm, however other single crystal wafers can be used. The first step 501 in the process is to grow a protective oxide layer 551 on both sides of wafer 550, and to deposit (step 502) a layer of photoresist 552 over both sides of oxide layer 551. Oxide layer 551 is preferably 1000 Å thick. Photo alignment marks are patterned (step 503) onto both sides of DSP wafer 550, and portions of oxide layer 551 underlying the photo alignment marks are etched away (step 504). The remaining photoresist 552 is stripped away (step 505), and a hard mask 553 is deposited (step 506) onto the backside of wafer 550. In one embodiment, hard mask 553 is a 1000 Å thick aluminum film, but other hard masks may be used.

Hard mask 553 serves to mask portions of wafer 550 in later deep reactive ion etching (DRIE) process steps. A new layer of photoresist 554 is deposited (step 507) on both sides of wafer 550, and a mask of support post 120 is patterned (step 508) onto the bottom photoresist layer 554. Now referring to FIG. 5B, portions of hard mask 553 that are exposed by the support post mask are etched away (step 509) using a suitable etchant. Similarly, portions of protective oxide layer 551 that are exposed by the support post mask are etched away (step 510) with a buffered oxide etch. The remaining photoresist 554 is stripped away (step 511) and a third layer of resist 555 is deposited (step 512) onto both sides of wafer 550. Alignment marks are transferred (step 513) to the bottom resist layer 555 to define two alignment bores 560 that are pre-etched (step 514) into wafer 550 using a deep reactive ion etch (DRIE). In one embodiment, alignment bores 560 are pre-etched approximately 40 um deep using a Bosch-type DRIE, however other DRIE chemistries may be used. Similarly, other process steps allowing for the creation of high aspect ratio bores may be used such as LIGA process steps.

Once the alignment bores have been pre-etched, the bottom resist layer 555 is stripped away (step 515), and the alignment bores 560 are completely etched (step 516) into wafer 550, as is an annular bore 570 that defines support post 120 and the base of mirrored surface 101 (see FIG. 1). In one embodiment, alignment bores 560 and annular bore 570 are etched an additional 50 um using a Bosch-type DRIE. Finally, the processing of wafer 550 is completed by stripping off (step 517) hard mask 553, bottom oxide layer 551 (step 518), and top photoresist layer 555 (step 519). What remains is wafer 550 with a top oxide layer 551, two alignment bores 560, and an annular bore 570 that defines mirror support post 120 and the base of mirrored surface 101 (FIG. 1).

As shown in FIG. 6, the entire electrostatic actuation layer 200 (see FIG. 2) is made from a single crystal silicon wafer 650 by the process disclosed in steps 601–605. In one embodiment, wafer 650 is a double-side-polished (DSP) silicon-on-oxide (SOI) wafer. In that embodiment, the bulk of SOI wafer 650 is used merely to safely handle the delicate actuation layer 200 (FIG. 2) that is built on upper silicon layer 652. The process begins by spinning (step 602) a layer of photoresist 651 onto the front side of SOI wafer 650. The entire electrostatic actuation layer 200 (FIG. 2) is patterned (step 603) onto photoresist layer 651 with an actuator mask. As shown in FIG. 2, actuation layer 200 includes support frame 107, electrostatic actuators 103, actuator flexures 106, freely movable plate 102, and plate flexures 104 and 105. Referring again to FIG. 6, the actuator mask also patterns alignment marks 653 onto photoresist layer 651 to later align SOI wafer 650 with wafer 550. The portions of upper silicon layer 652 exposed by the actuator mask are etched away (step 604) in a DRIE process step. In one embodiment, the actuation layer 200 is etched away using a 25 m deep Bosch-type DRIE. The remaining photoresist layer 651 is stripped away (step 605), leaving the structures of the actuation layer 200 (FIG. 2), and alignment marks 653 carved into upper layer 652 of SOI wafer 650. While steps 601–605 have described a method of making actuation layer 200 (FIG. 2) using an SOI wafer 650, other single crystal silicon wafers may be used.

As shown in FIG. 7, SOI wafer 650 and wafer 550 are fusion bonded together in steps 701–705 after both wafer have been individually processed as disclosed in FIGS. 5 and 6. The first step in the bonding process is to thoroughly clean (step 701) wafers 550 and 650 to remove unwanted contaminants and to ensure a good silicon-on-silicon bond. In one embodiment, wafers 550 and 650 are cleaned using the Radio Corporation of America (RCA) cleaning process. Wafers 550 and 650 are then aligned along their respectively etched alignment bores 560 and marks 653, and are fusion bonded (step 702) together. The alignment of wafers 550 and 650 is such that mirror support post 120 (FIG. 1) of wafer 550 is fusion bonded to freely movable plate 102 (FIG. 2) of upper layer 652 of SOI wafer 650 in step 702. Thus, after step 702, any distinctions made between mirror support post 120 and freely movable plate 102 are merely formal and made to ease the description of the invention. Nonetheless, the process as disclosed allows one to make a freely movable plate that need not be bonded to a mirror support post or mirror, and the invention is not limited to the actuation of a mirrored surface. Once wafers 550 and 650 are fusion bonded together, the bulk of SOI wafer 650 is ground away (step 703), while the remainder is etched away (step 704) in a slow KOH etch. Finally, the oxide layer is stripped away (step 705), leaving electrostatic actuation layer 200 (FIG. 2), including movable plate 102 fusion bonded to support post 120, a base for mirrored surface 101, and a protective oxide layer 551 on top.

As shown in FIGS. 8A–8B, reference surface 110 (FIG. 1) is readily made from a single crystal silicon wafer 850 by the process disclosed in steps 801–816. The first process step is to select (step 801) a silicon wafer 850 that is suitably flat. In one embodiment, wafers 850 having a total thickness variation of less than 3 um are chosen. A thermal oxide layer 851 is grown (step 802) on wafer 850, and a layer of photoresist 852 is spun (step 803) onto the top of wafer 850. The photoresist layer 852 is patterned (step 804) with a mask to carve divots out of wafer 850. Portions of oxide layer 851 exposed by the divot mask are etched away (step 805), and the remaining photoresist is stripped away (step 806). Divots 853 are carved (step 807) into wafer 850 using a KOH etch. In one embodiment, divots 853 are 10 um deep by 10 um wide by 10 microns long, and are carved into wafer 850 to provide clearance for actuator flexures 105 when actuators 103 are maximally rotated (FIG. 2). As previously disclosed, in one embodiment actuators 103 can be rotated by angles as large as 1 degree. When they are, flexures 105 can be deflected by as much as 16 um, which is 6 um more than gap 308 between actuator frame 107 and reference surface 110 (FIG. 3). In that embodiment, divots 853 are carved into wafer 850 to provide for these large deflections.

Referring to FIG. 8B, once divots 853 have been carved into wafer 850, oxide layer 851 is stripped away (step 808), and a new 1 um thick thermal oxide layer 854 is grown (step 809) on both sides of wafer 850. A conductive layer 855 is sputtered (step 810) onto top oxide layer 854, and a layer of photoresist 856 is deposited (step 811) over conductive layer 855 while back oxide layer 854 is stripped away. In one embodiment, conductive layer 855 is a 1.2 um thick aluminum layer, however other conductive layers are possible. Photoresist layer 856 is patterned (step 812) with a mask for control electrodes 108 and 109 (FIG. 3) and for traces from the control electrodes to externally located bonding pads. Portions of conductive layer 855 exposed by the control electrode mask are etched away (step 813), and the remaining photoresist is stripped from the surface (step 814).

An optional mechanical stopping layer can be deposited and patterned onto the top surface of wafer 850 to electrically isolate actuators 103 and flexures 104 and 105 (FIG. 2) from control electrodes 108 and 109 (FIG. 3) during rotation of plate 102 (FIG. 2). A plurality of materials can be used for this isolation layer including PMMA, SU-8, BCB, polyimides, polyimides optimized for LCD processing, silicon nitride, silicon-rich silicon nitride, and silicon dioxide. Materials such as silicon-rich silicon nitride and polyimides optimized for LCD processing may be preferable since they provide a small leakage path to ground, and can therefore prevent long term voltage drift effects by readily dissipating charge buildup. In one embodiment, the mechanical stopping layer is a 1 µm thick polyimide layer patterned and etched to produce an array of polyimide dots or a sequence of polyimide stripes on the surface of wafer 850. The layer prevents electrical shorts between the components of actuation layer 200 (FIG. 2) and control electrodes 108 and 109 (FIG. 3) when plate 102 is rotated beyond its designed range.

Once the control electrodes and any mechanical stopping layer are made, a separation layer 857 is deposited (step 815) onto the top surface of wafer 850, and a standoff post mask is patterned onto it. In one embodiment, separation layer 857 is a 10 um thick polyimide layer, however other materials such as low temperature solders may be used. Portions of separation layer 857 exposed by the standoff post mask are etched away (step 816), leaving the reference surface 110 (FIG. 3) with an oxidized top surface 854, flexure divots 853, control electrodes 108 and 109 (FIG. 3) together with their electrical traces, and standoff posts 115.

As shown in FIG. 9, processing on electrostatically actuated mirror 100 is completed when reference surface 110 is bonded (steps 901–903) to actuation layer 200 (FIG. 2), and mirror support post 120, and mirrored surface 101 is etched (steps 904–910) out of wafer 550. In the first processing step, wafer 850 is aligned (step 901) with fused wafers 650 and 550 so that the standoff posts 115 (FIG. 3) on wafer 850 are properly aligned with the support frame 107 (FIG. 3) on wafer 650. The wafers are bonded together (step 903) using a low temperature bonding technique such as a solder bond, a eutectic bond, a polymeric bond, or a thermo-compression bond. The maximum bonding temperature is chosen to be compatible with the thermal budget of the control electrodes and addressing circuitry etched into wafer 850. In general, the maximum thermal budget of the addressing circuitry and control electrodes will be in the range of 350° C. to 425° C., so that the maximum bonding temperature is chosen to be less than 350° C. In one embodiment, standoff posts 115 (FIG. 3) are made from a 10 µm thick polyimide layer, and a polymeric bonding technique is used to bond wafer 850 to fused wafers 550 and 650 under appropriate conditions of temperature and pressure.

A reflective layer 950 is deposited (step 904) onto the top surface of wafer 550. In one embodiment, reflective layer 950 consists of a 1000 Å thick gold layer deposited over a 100 Å thick titanium layer, however other reflective layers are possible. A photoresist layer 951 is deposited (step 905) over reference layer 950, and a mirror mask is patterned (step 906) onto it. Portions of reference layer 950 exposed by the mirror mask are etched away (step 907). Similarly, portions of wafer 550 exposed by the mirror mask are etched away (step 908) thereby freeing mirrored surface 101. The remaining photoresist is stripped away (step 909), leaving the microelectromechanical mirror 100 as shown in FIG. 1.

In final release step 908, some undesired etching of plate and actuator flexures 104–106 (FIG. 2) can occur. This undesired etching is particularly true in mirror geometries where the length and flexibility of flexures 104–106 (FIG. 2) are insufficient to dissipate the heat generated by the DRIE process at the surface of mirror wafer 550. As mirror wafer 550 heats up, a partial loss of the masking layer protecting flexures 104–106 (FIG. 2) can occur, exposing the flexures to the etch. To minimize this exposure, a member of techniques can be employed. The first technique is to use a two step etch, where the first etch is a DRIE etch to remove the bulk of the exposed portions of wafer 550. This etch proceeds until the exposed portions of wafer 550 become so thin that most of the heat generated by the DRIE etch is conducted away through flexures 104–106 (FIG. 2). At that point a lower power etch is used to complete the release of mirrored surface 101. For example, in one embodiment a freon/$SF_6$ etch is used as the second etch step.

The second technique to minimize the exposure of flexures 104–106 (FIG. 2) in process step 908 is to use a hard etch mask such as a metal mask or an oxide mask to protect the flexures. For example, in one embodiment an aluminum mask is used. A photoresist mask can be used together with the hard mask. For example, the entire surface of wafer 550 can be covered with a hard mask such as an Al mask, while the outer edges of the wafer can be covered with a photoresist mask. Portions of wafer 550 exposed by the mirror mask can be pre-etched before stripping away the photoresist mask. By optimizing the area of the photoresist mask and the pre-etch time, the time needed to release mirrored surface 101 through etching can be minimized, thereby minimizing the exposure of flexures 104–106 (FIG. 2) to etching. Finally, the third technique to minimize the exposure of flexures 104–106 (FIG. 2) is to make mirrored surface 101 (FIG. 1) large enough to shield flexures 104–106 (FIG. 2) during release etch 908.

As is well known in the art of IC manufacturing, the process disclosed in FIGS. 5–9 for making an individual mirror 100 can be readily adapted to make a plurality of mirrors in a mirror array by regularly repeating the process mask for individual mirror 100 in the desired mirror array geometry. In one embodiment the process masks are repeated to produce a mirror array as shown in FIG. 10. As shown in FIG. 10, four actuation layers 200 corresponding to four mirrors 100 (FIG. 1) arranged in a 2×2 array are shown. In general, an array of mirrors 100 (FIG. 1) of arbitrary dimensions can be made. In one embodiment, a 30×40 mirror array is made for use in an all optical cross connect switch.

A member of specific embodiments of the invention have been described. Nevertheless, it will be understood that various modifications may be made without departing from the spirit and scope of the invention. For example, the mirror can be made by different process steps than the steps disclosed here, or the order of two or more process steps or sequences of process steps can be interchanged. For example, the DRIE steps can be replaced with equivalent LIGA steps, and different etchants and masking materials can be used in some or all of the disclosed process steps. For example, the mirrored surface can be plated with any highly polished metallic surface such as a silver surface.

While the invention has been described using four electrostatic actuators and control electrodes that are symmetrically distributed about the movable plate, different members and types of actuators can be used and need not be symmetrically distributed about the movable plate. Similarly, different actuation means can be used. For example, electromagnetic, piezoelectric, or thermal actuation means can be used. Two, three, or more actuators can be used to move the plate and mirror. The actuators can be asymmetrically distributed about the plate and the control voltages asymmetrically applied to obtain the desired plate movement.

While the invention has been described as having the actuators suspended from a support frame held above a reference surface by a plurality of standoff posts, the actuators can be suspended from a plurality of support posts extending from the reference surface. While the invention has been described as selectively moving the actuators to rotate the freely movable plate, the invention can be used to translate the plate toward or away from the reference surface without rotating it. For example, referring back to FIG. 3, when similar control voltages are applied to the distal electrodes 108 and 108' respectively controlling actuators 103 and 103', actuator 103' will rotate clockwise in the direction 301' while actuator 103 will rotate counterclockwise, opposite to the direction 301 indicated in FIG. 3. As a result of these rotations, flexures 105 and 105' will be pulled away from reference surface 110 and will extend to respectively pull plate 102 away from surface 110 and toward actuators 103 and 103'. The net restoring force exerted on plate 102 will be a vertical restoring force pulling plate 102 away from reference surface 110 without rotating it. Plate 102 can be similarly pushed toward reference surface 110 by selectively applying similar voltages to proximal electrodes 109 and 109'.

Accordingly, these and other embodiments of the invention are within the scope of the following claims.

What is claimed is:

1. A method for manufacturing an electrostatically actuated plate, comprising:
   depositing a plurality of control electrodes on a reference layer substrate;
   depositing a plurality of standoff posts on the reference layer substrate;
   etching an actuation layer from an actuation layer substrate, the actuation layer comprising a freely movable plate flexibly suspended from a plurality of electrostatic actuators that are flexibly suspended from a support frame; and
   bonding the reference layer substrate to the actuation layer substrate so that the actuation layer substrate is held above the reference layer substrate by the plurality of standoff posts.

2. The method of claim 1, wherein the step of etching an actuation layer from an actuation layer substrate further comprises etching a plurality of pairs of torsional flexures in the actuation layer substrate to flexibly suspend each electrostatic actuator from the support frame by a respective pair of torsional flexures.

3. The method of claim 1, wherein the step of etching an actuation layer from an actuation layer substrate further comprises etching a plurality of torsional flexures in the actuation layer substrate to flexibly suspend the freely movable plate from the plurality of electrostatic actuators.

4. The method of claim 1, wherein the step of depositing a plurality of control electrodes on the surface of the reference layer substrate further comprises depositing a metallic layer on the surface of the reference layer substrate; and etching the plurality of control electrodes from the metallic layer.

5. The method of claim 4, further comprising etching addressing circuitry out of the metallic layer deposited on the reference layer substrate to address the plurality of control electrodes formed thereon.

6. The method of claim 1, wherein the actuation layer substrate is etched with a high aspect ratio etch.

7. The method of claim 1, further comprising etching a plurality of divots in the surface of the reference layer substrate.

8. The method of claim 1, further comprising depositing a mechanical stopping layer on the surface of the reference layer substrate to electrically isolate the plurality of electrostatic actuators from the plurality control electrodes.

9. The method of claim 1, wherein the step of depositing the plurality of standoff posts on the surface of the reference layer substrate further comprises depositing a photoimageable layer on the surface of the reference layer substrate; and etching the photoimageable layer to form the plurality of standoff posts.

10. The method of claim 9, wherein the photoimageable layer comprises a polyimide layer.

11. The method of claim 1, wherein the standoff posts serve as both a separation layer to hold the actuation layer substrate above the reference layer substrate, and as a bonding layer to bond the actuation layer substrate to the reference layer substrate.

12. The method of claim 1, wherein a low temperature bonding technique is used to bond the reference layer substrate to the actuation layer substrate.

13. The method of claim 12, wherein the low temperature bonding technique is chosen from the group consisting of solder bonding, eutectic bonding, polymeric bonding, and thermo-compression bonding.

14. The method of claim 1, wherein one or more of the reference and actuation layer wafers are chosen with low total thickness variations.

15. A method for manufacturing a microelectromechanical mirror, comprising:
   depositing a plurality of control electrodes on a reference layer substrate;
   depositing a plurality of standoff posts on the reference layer substrate;
   etching an actuation layer from an actuation layer substrate, the actuation layer comprising a freely movable plate flexibly suspended from a plurality of electrostatic actuators that are flexibly suspended from a support frame;
   etching a mirror support post from a mirror layer substrate;
   bonding the freely moveable plate in the actuation layer substrate to the mirror support post in the mirror layer substrate;
   bonding the reference layer substrate to the actuation layer substrate so that the actuation layer substrate is held above the reference layer substrate by the plurality of standoff posts;
   depositing a reflective layer on the surface of the mirror layer substrate; and
   etching through the reflective layer and the mirror layer substrate to release the microelectromechanical mirror.

16. The method of claim 15, wherein the step of etching an actuation layer from an actuation layer substrate further comprises etching a plurality of pairs of torsional flexures in the actuation layer substrate to flexibly suspend-each electrostatic actuator from the support frame by a respective pair of torsional flexures.

17. The method of claim 15, wherein the step of etching an actuation layer from an actuation layer substrate further comprises etching a plurality of torsional flexures in the actuation layer substrate to flexibly suspend the freely movable plate from the plurality of electrostatic actuators.

18. The method of claim 15, wherein the step of depositing a plurality of control electrodes on the reference layer substrate further comprises depositing a metallic layer on the surface of the reference layer substrate; and etching the plurality of control electrodes from the metallic layer.

19. The method of claim 18, further comprising etching addressing circuitry out of the metallic layer deposited on the reference layer substrate to address the plurality of control electrodes formed thereon.

20. The method of claim 15, wherein the actuation layer substrate is etched with a high aspect ratio etch.

21. The method of claim 15, further comprising etching a plurality of divots in the surface of the reference layer substrate.

22. The method of claim 15, further comprising depositing a mechanical stopping layer on the surface of the reference layer substrate to electrically isolate the plurality of electrostatic actuators from the plurality of control electrodes.

23. The method of claim 15, wherein the plurality of standoff posts are made from a photoimageable material.

24. The method of claim 23, wherein the step of depositing a plurality of standoff posts on the surface of the reference layer substrate further comprises depositing a polyimide layer on the surface of the reference layer substrate; and etching the polyimide layer to form the plurality of standoff posts.

25. The method of claim 15, wherein the standoff posts serve as both a separation layer to hold the actuation layer substrate above the reference layer substrate, and as a bonding layer to bond the actuation layer substrate to the reference layer substrate.

26. The method of claim 15, wherein a low temperature bonding technique is used to bond the reference layer substrate to the actuation layer substrate.

27. The method of claim 26, wherein the low temperature bonding technique is chosen from the group consisting of solder bonding, eutectic bonding, polymeric bonding, and thermo-compression bonding.

28. The method of claim 15, wherein one or more of the reference, actuation, and mirror layer wafers are chosen with low total thickness variations.

29. The method of claim 15, wherein the reflective layer deposited on the surface of the mirror layer substrate comprises a metallic layer.

30. The method of claim 15, wherein the step of bonding the mirror support post of the mirror layer substrate to the freely movable plate of the actuation layer substrate further comprises fusion bonding the mirror support post to the freely movable plate.

31. The method of claim 15, wherein the step of etching through the reflective layer and the mirror layer substrate to release the microelectromechanical mirror further comprises protecting the actuation layer from the release etch.

32. The method of claim 31, wherein the step of protecting the actuation layer from the release etch comprises one or more of the steps chosen from the group consisting of using the mirror surface as a protective etch mask, using a two step release etch, or using an oxide mask to protect the actuation layer.

33. The method of claim 15, further comprising:
etching a plurality of alignment marks in the actuation layer wafer;
etching a respective plurality of alignment bores in the mirror layer wafer; and
aligning the plurality of alignment marks in the actuation layer wafer with the respective plurality of alignment bores in the mirror layer wafer to bond the mirror support post in the mirror layer wafer with the freely movable plate in the actuation layer wafer.

34. A method of manufacturing a freely movable plate, comprising:
etching an actuation layer from an actuation layer substrate, the actuation layer comprising a freely movable plate flexibly suspended from a plurality of actuators that are flexibly suspended from a support structure;
forming a respective plurality of actuation means on a reference layer substrate to respectively actuate the plurality of actuators;
forming means for separating the actuation layer substrate from the reference layer substrate on one of the actuation layer substrate or the reference layer substrate; and
bonding the reference layer substrate to the actuation layer substrate so that the actuation layer substrate is separated from and held above the reference layer substrate by the separation means.

35. The method of claim 34, wherein the step of forming means for separating the actuation layer substrate from the reference layer substrate further comprises depositing a photoimageable layer on the surface of the reference layer substrate; and etching the photoimageable layer to form a plurality of standoff posts.

36. The method of claim 35, wherein the photoimageable layer comprises a polyimide layer.

37. The method of claim 34, wherein the means for separating the reference layer substrate from the actuation layer substrate further comprise means for bonding the reference layer substrate to the actuation layer substrate.

38. The method of claim 34, wherein a low temperature bonding technique is used to bond the reference layer substrate to the actuation layer substrate.

39. The method of claim 38, wherein the low temperature bonding technique is chosen from the group consisting of solder bonding, eutectic bonding, polymeric bonding, and thermo-compression bonding.

40. The method of claim 34, further comprising forming addressing means on the reference layer substrate to selectively address the actuation means formed thereon.

41. The method of claim 34, wherein the plurality of actuators are chosen from among the group consisting of electrostatic, electromagnetic, piezoelectric, and thermal actuators.

42. The method of claim 34, wherein the actuation means for respectively actuating the plurality of actuators are chosen from among the group consisting of electrostatic, electromagnetic, piezoelectric, and thermal actuation means.

43. The method of claim 34, wherein the step of forming a plurality of actuation means on the reference layer wafer for respectively actuating the plurality of actuators comprises forming a plurality of rotation means for respectively rotating the plurality of actuators.

44. The method of claim 34, wherein the step of forming a plurality of actuation means on the reference layer wafer for respectively actuating the plurality of actuators comprises forming a plurality of translation means for respectively translating the plurality of actuators.

45. The method of claim 34, wherein the actuation layer substrate is etched with high aspect ratio etch.

46. A method for manufacturing a microelectromechanical mirror, comprising:
etching an actuation layer from an actuation layer substrate, the actuation layer comprising a freely movable plate flexibly suspended from a plurality of actuators that are flexibly suspended from a support structure;
forming a respective plurality of actuation means on a reference layer substrate to respectively actuate the plurality of actuators;
etching a mirror support post from a mirror layer substrate;
bonding the freely movable plate in the actuation layer substrate to the mirror support post in the mirror layer substrate;

forming means for separating the actuation layer substrate from the reference layer substrate on one of the actuation layer substrate or the reference layer substrate;

bonding the reference layer substrate to the actuation layer substrate so that the actuation layer substrate is separated from and held above the reference layer substrate by the separation means;

depositing a reflective layer on the surface of the mirror layer substrate; and etching through the reflective layer and the mirror layer substrate to release the microelectromechanical mirror.

47. The method of claim 46, wherein the step of forming means for separating the actuation layer substrate from the reference layer substrate further comprises depositing a photoimageable layer on the surface of the reference layer substrate; and etching the photoimageable layer to form a plurality of standoff posts.

48. The method of claim 46, wherein the photoimageable layer comprises a polyimide layer.

49. The method of claim 46, wherein the means for separating the reference layer substrate from the actuation layer substrate further comprise means for bonding the reference layer substrate to the actuation layer substrate.

50. The method of claim 46, wherein a low temperature bonding technique is used to bond the reference layer substrate to the actuation layer substrate.

51. The method of claim 50, wherein the low temperature bonding technique is chosen from the group consisting of solder bonding, eutectic bonding, polymeric bonding, and thermo-compression bonding.

52. The method of claim 46, further comprising forming addressing means on the reference layer substrate to selectively address the actuation means formed thereon.

53. The method of claim 46, wherein the plurality of actuators are from among the group comprising electrostatic, electromagnetic, piezoelectric, and thermal actuators.

54. The method of claim 46, wherein the actuation means for respectively actuating the plurality of actuators are respectively from among the group comprising electrostatic, electromagnetic, piezoelectric, and thermal actuation means.

55. The method of claim 46, wherein the step of forming a plurality of actuation means for respectively actuating the plurality of actuators comprises forming a plurality of rotation means for respectively rotating the plurality of actuators.

56. The method of claim 46, wherein the step of forming a plurality of actuation means for respectively actuating the plurality of actuators comprises forming a plurality of translation means for respectively translating the plurality of actuators.

57. The method of claim 46, wherein the actuation layer substrate is etched with high aspect ratio etch.

58. The method of claim 46, wherein the reflective layer deposited on the surface of the mirror layer substrate comprises a metallic layer.

59. The method of claim 46, wherein the step of bonding the mirror support post of the mirror layer substrate to the freely movable plate of the actuation layer substrate further comprises fusion bonding the mirror support post to the freely movable plate.

60. The method of claim 46, wherein one or more of the reference, actuation, and mirror layer wafers are chosen with low total thickness variations.

61. The method of claim 46, wherein the step of etching through the reflective layer and the mirror layer substrate to release the microelectromechanical mirror further comprises protecting the actuation layer from the release etch.

62. The method of claim 46, wherein the step of protecting the actuation layer from the release etch comprises one or more of the steps chosen from the group consisting of using the mirror surface as a protective etch mask, using a two step release etch, and using an oxide mask to protect the actuation layer.

63. The method of claim 46,
further comprising:

etching a plurality of alignment marks in the actuation layer wafer;

etching a respective plurality of alignment bores in the mirror layer wafer; and aligning the plurality of alignment marks in the actuation layer wafer with the respective plurality of alignment bores in the mirror layer wafer to bond the mirror support post in the mirror layer wafer with the freely movable plate in the actuation layer wafer.

64. A method for manufacturing a microelectromechanical mirror array comprising a plurality of microelectromechanical mirrors, the method of manufacture comprising:

depositing a metallic layer on a reference layer substrate and forming an arrayed pattern comprising a plurality of control electrodes on the metallic layer;

forming an arrayed pattern comprising a plurality of standoff posts on the reference layer substrate;

etching an arrayed pattern of actuation layers from an actuation layer substrate, each actuation layer in the arrayed pattern comprising a freely movable plate flexibly suspended from a plurality of electrostatic actuators that are flexibly suspended from a support frame;

etching an arrayed pattern of mirror support posts from a mirror layer substrate;

bonding the actuation layer substrate to the mirror layer substrate so that the freely movable plates in the arrayed pattern of actuation layers are bonded to respective ones of the mirror support posts in the arrayed pattern of mirror support posts;

bonding the reference layer substrate to the actuation layer substrate so that the arrayed pattern of actuation layers is held above the arrayed pattern of control electrodes by the arrayed plurality of standoff posts;

depositing a reflective layer on the surface of the mirror layer substrate; and etching in an arrayed pattern through the reflective layer and the mirror layer substrate to release the arrayed pattern of microelectromechanical mirrors in the microelectromechanical mirror array.

65. A method for manufacturing a microelectromechanical mirror array, comprising a plurality of microelectromechanical mirrors, the method comprising:

etching an arrayed pattern of actuation layers from an actuation layer substrate, each actuation layer in the arrayed pattern comprising a freely movable plate flexibly suspended from a plurality of actuators that are flexibly suspended from a support structure;

etching an arrayed pattern of mirror support posts from a mirror layer substrate;

bonding the actuation layer substrate to the mirror layer substrate so that the freely movable plates in the arrayed pattern of actuation layers are bonded to respective ones of the mirror support posts in the arrayed pattern of mirror support posts;

forming an arrayed pattern comprising a plurality of actuation means on a reference layer substrate to respectively actuate the arrayed plurality of actuators;

forming an arrayed means for separating the actuation layer substrate from the reference layer substrate on one of the actuation layer substrate or the reference layer substrate;

bonding the reference layer substrate to the actuation layer substrate so that the arrayed pattern of actuation layers are held above the arrayed pattern of actuation means by the arrayed pattern of separation means;

depositing a reflective layer on the surface of the mirror layer substrate; and etching in an arrayed pattern through the reflective layer and the mirror layer substrate to release the arrayed plurality of microelectromechanical mirrors in the microelectromechanical mirror array.

* * * * *